(12) United States Patent
Chauvin et al.

(10) Patent No.: US 8,742,787 B2
(45) Date of Patent: Jun. 3, 2014

(54) METHOD FOR DETECTING A SHORT-CIRCUIT, AND POWER SUPPLY MODULE IMPLEMENTING SAID METHOD

(75) Inventors: Karen Chauvin, Le Pecq (FR); Jean Gatinois, Jouars Pontchartrain (FR); Ruben Vela Garcia, Versailles (FR)

(73) Assignee: Valeo Systemes Thermiques, Le Mesnil Saint Denis, Cedex (FR)

( * ) Notice: Subject to any disclaimer, the term of this patent is extended or adjusted under 35 U.S.C. 154(b) by 255 days.

(21) Appl. No.: 13/201,664

(22) PCT Filed: Feb. 5, 2010

(86) PCT No.: PCT/EP2010/051414
§ 371 (c)(1),
(2), (4) Date: Sep. 22, 2011

(87) PCT Pub. No.: WO2010/092007
PCT Pub. Date: Aug. 19, 2010

(65) Prior Publication Data
US 2012/0007629 A1    Jan. 12, 2012

(30) Foreign Application Priority Data

Feb. 16, 2009   (FR) ...................................... 09 00690

(51) Int. Cl.
*G01R 31/40*    (2014.01)
(52) U.S. Cl.
USPC .................................................... 324/764.01
(58) Field of Classification Search
USPC ............... 324/764.01, 765.01, 105, 324/762.01–762.1, 750.3; 361/166, 160, 361/167; 320/134, 136, 103, 112, 107; 438/14–18; 257/48, 84
See application file for complete search history.

(56) References Cited

U.S. PATENT DOCUMENTS

| 5,428,967 A | 7/1995 | Goto et al. | |
|---|---|---|---|
| 7,061,201 B2 * | 6/2006 | Goumain et al. | ............ 318/599 |
| 7,492,162 B2 | 2/2009 | Hachisuka et al. | |
| 2008/0284392 A1 * | 11/2008 | Itoh | .............................. 323/277 |

FOREIGN PATENT DOCUMENTS

| DE | 19807907 A1 | 9/1999 |
|---|---|---|
| EP | 1519465 A1 | 3/2005 |

OTHER PUBLICATIONS

English language abstract for DE 19807907 extracted from the espacenet.com database on Oct. 21, 2011, 7 pages.
English language abstract for EP 1519465 extracted from the espacenet.com database on Oct. 21, 2011, 10 pages.
International Search Report for Application No. PCT/EP2010/051414 dated Mar. 18, 2010, 5 pages.

* cited by examiner

*Primary Examiner* — Melissa Koval
*Assistant Examiner* — Trung Nguyen
(74) *Attorney, Agent, or Firm* — Howard & Howard Attorneys PLLC

(57) ABSTRACT

The present invention relates to a power supply module (100) for an electrical device (10), in particular using direct current, the power supply module (100) including a capacitor-input filter (120) arranged in parallel on the electrical device (10). The power supply module (100) comprises a means (130, 200) for detecting the discharge current ($I_{cc}$) supplied by the capacitor-input filter (120) following a short-circuit in the power supply module (100). The invention can be used the power supply circuits of automobile electrical devices, in particular the motors of an electric fan unit for creating an air flow in heating, ventilation and/or air-conditioning systems.

6 Claims, 1 Drawing Sheet

METHOD FOR DETECTING A SHORT-CIRCUIT, AND POWER SUPPLY MODULE IMPLEMENTING SAID METHOD

RELATED APPLICATIONS

This application claims priority to and all the advantages of International Patent Application No. PCT/EP2010/051414, filed on Feb. 5, 1010, which claims priority to French Patent Application No. FR 09/00690, filed on Feb. 16, 2009.

The present invention relates to a method for detecting a short-circuit in a power supply module for an electrical device, in particular using direct current. It also relates to a power supply module suitable for using such a method.

The invention finds a particularly advantageous application in the field of direct current power supply circuits of automobile electrical devices, in particular the motors of an electric fan unit suitable for creating an air flow in heating, ventilation and/or air-conditioning systems.

The heating, ventilation and/or air-conditioning systems of automobiles generally comprise an electric fan unit intended for providing an air flow in the passenger compartment of the vehicle. Said electric fan unit comprises a turbine driven by an electric motor operating by means of a current supplied by a power supply module.

In practice, the power supply modules used in said application are arranged between a power supply source, in particular, a battery arranged inside the vehicle, and the electric motor to be supplied. They comprise a printed circuit board on which are installed the components necessary for supplying the electric motor with power from the power supply source, in particular the battery of the vehicle. In particular, the power supply modules may comprise a current switch, in particular of the 'PWM' (Pulse Width Modulation) type.

The PWM current switch makes it possible to vary the cyclic ratio of voltage pulses constructed from the power supply voltage, therefore from the battery according to a preferred example.

The power supply modules further comprise a heat-dissipation device, such as a radiator, for evacuating the heat produced by the components, as well as one or more connectors intended for receiving the bundles of conductors respectively connecting the power supply module to the battery and to the electric motor.

In general, the electronic components present in such power supply modules also include a high-capacitor-input filter placed at the input of the power supply module, in parallel on the battery and the electric motor. In particular, the most frequently used capacitor-input filters are chemical capacitors the armatures of which having a fixed polarity.

With said type of power supply modules, there is a risk of short-circuit between the conductors of the bundles connected to the connectors that may in particular result in the short-circuiting of the capacitor-input filter. The result of said short-circuit situation is that the current delivered by the power supply source increases significantly with the consequence of heating the conductors of the power supply bundles that may go as far as the fusion of same.

On the other hand, the discharge from the capacitor-input filter may produce very high currents, in the order of 200 A, significantly exceeding the nominal values of approximately 30A. With such currents, the components of the power supply module heat up, in particular the current switch, for example of the PWM type, and may ignite the epoxy material constituting the printed circuit board (also known as 'PCB').

Said risk of flash-over is even greater, when in the event of short-circuit the radiator of the printed circuit board can no longer cool the components that are located there due to the fact that, the electric motor no longer being supplied, same cannot produce the air flow needed to cool the radiator.

Therefore, there is a need to obtain an earlier detection of a short-circuit in the power supply module, so that measures aiming to limit the harmful consequences can be taken early enough.

In relation thereto, the invention proposes a method for detecting a short-circuit in a power supply module for an electrical device, in particular using direct current, the power supply module including a capacitor-input filter arranged in parallel on the electrical device. The method consists of detecting the discharge current supplied by the capacitor-input filter following the short-circuit.

Thus, as soon as the discharge current of the capacitor-input filter exceeds a given value, a short-circuit situation is immediately diagnosed, resulting in the implementation of means intended, for example, for invalidating the current in the discharge circuit of the capacitor-input filter, such as opening the current switch, in particular of the PWM type.

According to one embodiment of the invention, the discharge current is detected by measuring a voltage across the terminals of a resistive element arranged on the discharge circuit of the capacitor-input filter.

In particular, the invention envisages that the resistive element consists of a component for protecting the capacitor-input filter against a polarity reversal of the power supply current, for example a direct current.

Indeed, it is known, and as reminded previously, that the capacitor-input filter of the power supply module is a biased chemical capacitor the armatures of which must be connected to the corresponding polarity terminals of a power supply source, in particular a battery of an automobile. Consequently, a polarity reversal of the power supply source also produces a polarization reversal of the capacitor-input filter and the destruction of same.

According to one particular embodiment of the invention, the protective component is a power MOSFET transistor. In this case, the protection of the capacitor-input filter is obtained by applying to a gate of the power MOSFET transistor a gate-source voltage $V_{gs}$ below the conduction threshold as soon as a reversal of the power supply source is detected, so that the power MOSFET transistor becomes non-conductive and isolates the capacitor-input filter from the power supply source. Under normal conditions of use, the power MOSFET transistor is conductive, the gate-source voltage $V_{gs}$ then being above the conduction threshold.

The detection of the short-circuit of the capacitor-input filter is achieved by measuring a voltage across the terminals of the resistance $R_{dSON}$ of the power MOSFET transistor, either by a voltage amplifier or simply by means of a voltage comparator. Said embodiments may be particularly advantageous if a comparator or an unused amplifier is already present on a printed circuit board of the power supply module, in particular within the scope of the use of comparator or amplifier double or quadruple housings.

Another technical solution would be to place a current measurement shunt in the discharge circuit of the capacitor-input filter, for example in series with a current switch, in particular of the PWM type. However, said solution is less advantageous than that using a power MOSFET transistor as a protective element as same uses an additional, costly, bulky and heat-dissipator component.

The invention also relates to a power supply module for an electrical device, in particular using direct current, the power supply module including a capacitor-input filter arranged in parallel on the equipment. The power supply module comprises means for detecting the discharge current supplied by the capacitor-input filter following a short-circuit in the power supply module.

According to the invention, the means of detection include a resistive element arranged on the discharge circuit of the capacitor-input filter, and means for measuring a voltage across the terminals of the resistive element.

According to various embodiments, the means for measuring the voltage include a voltage amplifier and/or a voltage comparator.

In particular, the invention envisages that the resistive element consists of a component for protecting the capacitor-input filter against a polarity reversal of the power supply current, for example the direct current.

Preferably, the protective component is a power MOSFET transistor.

The following description with reference to the accompanying drawings, given by way of non-limitive examples, will provide clear understanding of the invention and how it can be achieved, drawings wherein:

FIG. 1 is a diagram of a power supply module for an electrical device, in particular a direct current electric motor, using a method for detecting a short-circuit.

The present invention is specific to a power supply circuit for an electrical device 10, in particular a direct current motor such as an electric fan unit motor for a heating, ventilation and/or air-conditioning system of an automobile.

Figure 1:
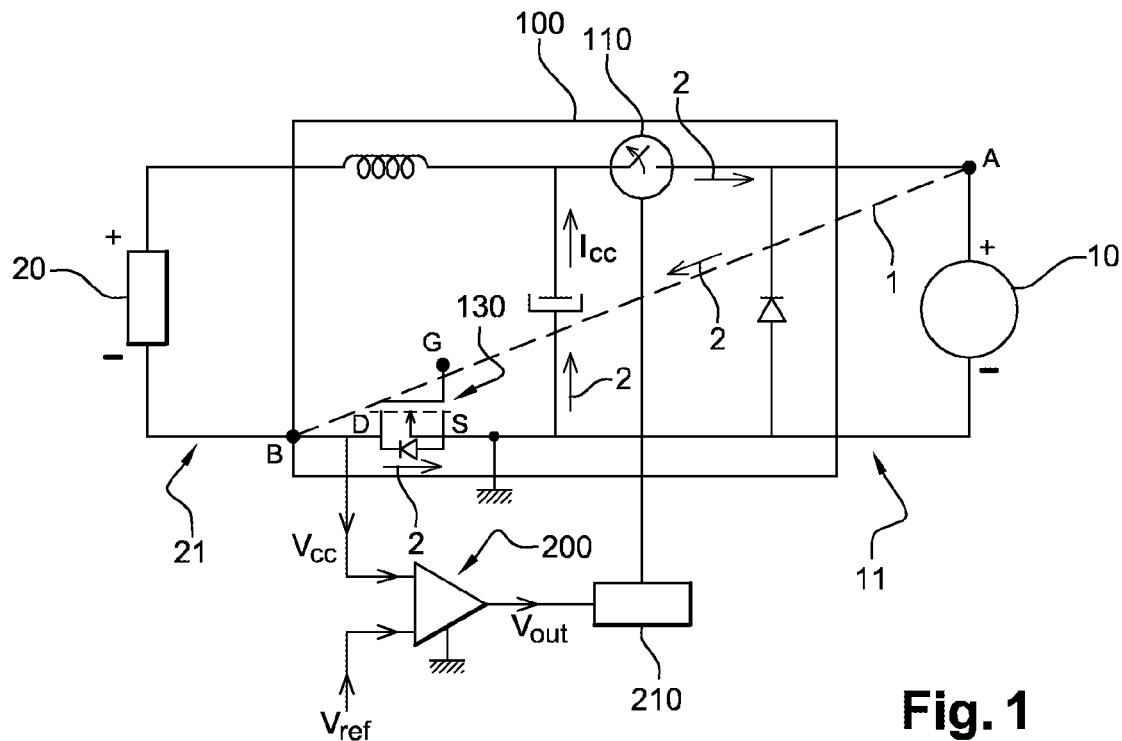
FIG. 1 is a diagram of a power supply module for an electrical device using the method for detecting a short-circuit in accordance with the invention.

The power supply circuit in FIG. 1 includes a power supply source 20 delivering a power supply current, in particular a direct current. The power supply source 20 is for example a battery arranged inside the automobile. The power supply circuit in FIG. 1 also comprises a power supply module 100 comprising various components, in particular installed on a printed circuit board (PCB). The printed circuit board is cooled by a radiator itself swept by an air flow generated by the electric fan unit controlled by the power supply module 100.

Among the components of the power supply module 100, a current switch 110 can be noted, in particular of the PWM type, suitable for delivering to the electrical device 10, in particular the electric motor of the electric fan unit, a power supply voltage. In particular, within the scope of the use of a current switch 110 of the PWM type, the power supply voltage supplied to the electrical device 10 is in the form of square wave signals of fixed frequency but of variable cyclic ratio.

The power supply module 100 also comprises a capacitor-input filter 120. Preferably, the capacitor-input filter 120 is of the electrochemical type arranged in parallel on the electrical device 10, for example the electric motor, and on the power supply source 20, in particular the battery.

In order to protect the capacitor-input filter 120 against any reversal of the power supply current, in particular of the direct current delivered by the battery, linked to the reversal of the poles of the power supply source 20, it is provided in the power supply module 100 a protective component 130 having the function of interrupting the current passing through the capacitor-input filter 120 as soon as a reversal of the power supply current is detected.

In the example of embodiment in FIG. 1, the protective component 130 is a power MOSFET transistor. The power MOSFET transistor generally comprises three terminals: a drain D, a source S and a gate G.

The transistor is mounted in the power supply module 100 in order to be conductive in nominal operating condition. In said state, the control potential applied to the gate G is such that a voltage $V_{gs}$ between the gate G and the source S is greater than a limit of a conduction threshold voltage $V_{gsth}$ of the power MOSFET transistor 130. The conduction threshold voltage $V_{gsth}$ is defined as being the voltage $V_{gs}$ for which an inversion zone appears, i.e. a creation of the conduction channel between the drain D and the source S.

When the voltage $V_{gs}$ is below the conduction threshold voltage $V_{gsth}$, the power MOSFET transistor 130 is blocked or non-conductive. In the opposite case, the power MOSFET transistor 130 is conducting, same carries the current between the drain D and the source S.

When a battery inversion is detected, the gate G is supported by a management central, not shown, with a potential for which the voltage $V_{gs}$ is below the conduction threshold voltage $V_{gsth}$. The power MOSFET transistor 130 then becomes non-conductive and thus cuts off the current through the capacitor-input filter 120.

A first bundle of conductors 21 connects the power supply source 20, in particular the battery, to a connector, not shown, of the power supply module 100. Similarly, another connector arranged on the power supply module 100 receives the conductors of a second bundle of conductors 11 connecting the electrical device 10, in particular the electric motor of the electric fan unit of a heating, ventilation and/or air-conditioning system of an automobile, to the power supply module 100.

Now, it may occur that a contact is produced between the conductors of the first bundle 21 and the conductors of the second bundle 11, causing a short-circuit in the power supply module 100. Such a short-circuit may be, for example, that connecting the '+' pole of the electrical device 10 to the '−' pole of the power supply source 20. Said short-circuit is shown in FIG. 1 by the dotted line 1.

In this case, the capacitor-input filter 120 discharges in the circuit. Such a discharge is shown by arrows 2 in FIG. 1. As previously explained, the current thus supplied by the capacitor-input filter 120 may reach significant values, in the order of 200 A. At such intensities, the components present on the printed circuit board of the power supply module 100, in particular the current switch 110, for example of the PWM type, may heat up to the point of igniting the epoxy material constituting the printed circuit board (PCB). Said risk is all the more significant, when the electrical device 10 is in particular the electric motor of the electric fan unit of a heating, ventilation and/or air-conditioning system of an automobile, the electric motor 10 is no longer supplied, the radiator of the printed circuit board is no longer cooled by the air flow produced by the electric fan unit. It is therefore necessary to be able to detect the short-circuit situation as soon as possible in order to avoid damaging effects.

In this aim, it is proposed to use the protective component 130, in particular the power MOSFET transistor, as means for detecting the short-circuit of the capacitor-input filter 120. More specifically, the power MOSFET transistor 130 in the conductive state constitutes a valuable resistive element $R_{dSON}$ making it possible to measure a discharge current $I_{dc}$ via the resistance $R_{dSON}$ of the power MOSFET transistor 130. For this, it is sufficient to measure a voltage $V_{dc}$ equal to the product of the resistance $R_{dSON}$ of the power MOSFET transistor 130 by the value of a discharge current $I_d$, across the terminals of the power MOSFET transistor 130, providing a protective function. Therefore, this gives:

$$V_{dc} = R_{dSON} \cdot I_{dc}$$

As indicated in FIG. 1, the measurement of the voltage $V_{dc}$ can be taken by means of a voltage comparator 200, i.e. of the voltage $V_{dc}$ and a reference voltage $V_{ref}$.

Figure 2:
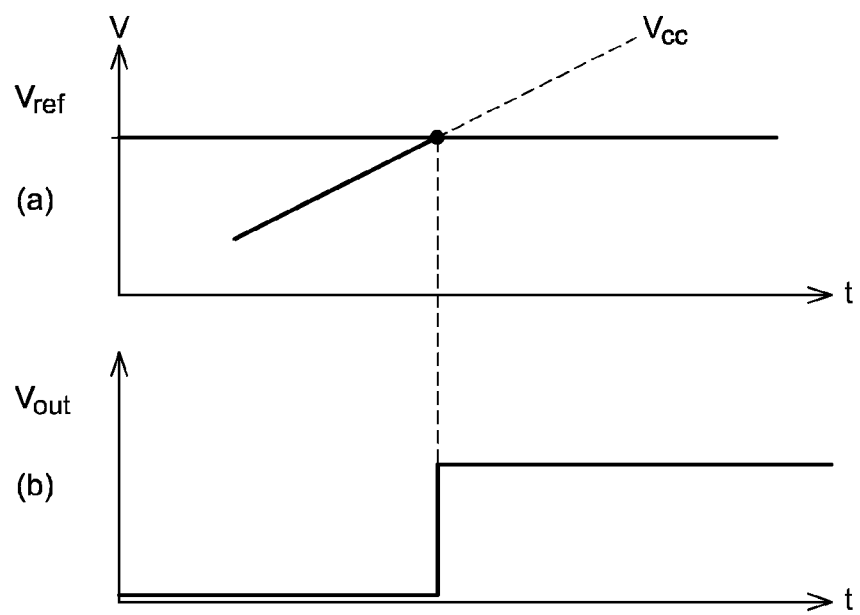
FIG. 2 shows in (a) a diagram of the voltages applied to the comparator of the power supply module of FIG. 1, and in (b) a corresponding diagram of the output signal of the comparator according to the present invention.

FIG. 2 shows in a diagram the voltages applied to the voltage comparator 200 of the power supply module 100 of FIG. 1 (FIG. 2 a), and a corresponding diagram of the output signal of the voltage comparator 200 (FIG. 2 b) according to the present invention.

As shown in FIG. 2, when a short-circuit occurs in the power supply module 100, the voltage $V_{dc}$ exceeds a value of the reference voltage $V_{ref}$ indicative of a short-circuit, the output voltage $V_{out}$ of the voltage comparator 200 therefore changes logic state, the detection of said change of state constituting the detection of the short-circuit.

The output voltage $V_{out}$ may in turn be used to end the short-circuit situation. For this, the output of the voltage comparator 200 is applied, for example, to a control circuit 210 of the current switch 110, in particular of the PWM type, in order to bring same to the open state and interrupt the short-circuit current in the discharge circuit of the capacitor-input filter 120.

Of course, the voltage $V_{dc}$ across the terminals of the power MOSFET transistor 130 could be measured by means other than a voltage comparator, such as for example a voltage amplifier.

Obviously, the invention is not limited to the embodiments previously described and supplied only by way of example and include other variants that could be envisaged by the person skilled in the art within the scope of the present invention and in particular any combinations of the various embodiments previously described.

The invention claimed is:

1. A method for detecting a short-circuit in a power supply module (100) for an electrical device (10), in particular using direct current, the power supply module (100) including a capacitor-input filter (120) arranged in parallel on the electrical device (10), characterized in that the method comprises detecting the discharge current ($I_{dc}$) supplied by the capacitor-input filter (120) following a short-circuit in the power supply module (100) by measuring a voltage ($V_{dc}$) across the terminals of a resistive element (130) arranged on the discharge circuit of the capacitor-input filter (120); and protecting the capacitor-input filter (120) against a polarity reversal of the power supply current by a protective component (130) of the resistive element.

2. A method according to claim 1, wherein the protective component (130) is a power MOSFET transistor (130).

3. A power supply module (100) for an electrical device (10), in particular using direct current, the power supply module (100) including a capacitor-input filter (120) arranged in parallel on the electrical device (10), characterized in that the power supply module (100) comprises means for detecting (130, 200) the discharge current ($I_{dc}$) supplied by the capacitor-input filter (120) following a short-circuit in the power supply module (100);

wherein the detection means include a resistive element (130) arranged on the discharge circuit of the capacitor-input filter (120), and means for measuring (200) a voltage ($V_{dc}$) across the terminals of the resistive element (130); and wherein the resistive element (130) comprises a protective component for protecting the capacitor-input filter (120) against a polarity reversal of the power supply current.

4. A power supply module (100) according to claim 3, wherein the means for measuring (200) the voltage ($V_{dc}$) include a voltage amplifier.

5. A power supply module (100) according to claim 3, wherein the means for measuring (200) the voltage ($V_{dc}$) include a voltage comparator.

6. A power supply module (100) according to claim 3, wherein the protective component is a power MOSFET transistor (130).

\* \* \* \* \*